United States Patent [19]

Tompkins

[11] 4,358,831
[45] Nov. 9, 1982

[54] SELF-BIASING CIRCUIT FOR ANALOG SHIFT REGISTERS, WITH FAT ZERO COMPENSATION

[75] Inventor: James D. Tompkins, Essex Junction, Vt.

[73] Assignee: International Business Machines Corporation, Armonk, N.Y.

[21] Appl. No.: 202,107

[22] Filed: Oct. 30, 1980

[51] Int. Cl.³ .............................................. G11C 11/40
[52] U.S. Cl. ...................................... 365/183; 365/78
[58] Field of Search .................................. 365/183, 78

[56] References Cited

U.S. PATENT DOCUMENTS 3,911,290 10/1975 Kenyon ................................. 365/183
4,010,485 3/1977 Sauer ..................................... 365/183
4,241,422 12/1980 Grüter ................................... 365/183

*Primary Examiner*—Terrell W. Fears
*Attorney, Agent, or Firm*—Francis J. Thornton

[57] ABSTRACT

An input bias circuit for a charge transfer device array in which the fat zero signal level is a function of device threshold voltage and other device parameters. The use of such a circuit eliminates the need to adjust or tune the reference or bias level from array to array. The circuit includes the addition of a diode connected field effect transistor and capacitor between the input device, the source of the first charge transfer device stage, and the input gating device such that the minimum discharge level is set, on the input node, a threshold voltage drop above the reference level. When device threshold voltages are higher the charge established on the input node is decreased to compensate for the decrease in charge transferred by the register stages. Matching of the sizes of the diode connected field effect transistor with the input device and the devices in each stage of the array insures accurate tracking with process variations.

11 Claims, 2 Drawing Figures

SELF-BIASING CIRCUIT FOR ANALOG SHIFT REGISTERS, WITH FAT ZERO COMPENSATION

BACKGROUND OF THE INVENTION

1. Field of the Invention

This invention relates generally to charge transfer device arrays and more particularly to charge transfer device registers into which a background (fat zero) signal level, equal to about 10 percent of the maximum signal, is introduced. The circuit of the invention may be used with any charge transfer device array, such as a bucket brigade or a charged transfer coupled device array.

2. Description of the Prior Art

Various techniques are known for providing initial charge level for time variant or analog signals in charge transfer technology devices, i.e. bucket brigade and charge coupled device circuits.

In U.S. Pat. No. 3,911,290 assigned to the same assignee as the present invention there is shown a bucket brigade circuit which although directed toward a shift register in which each storage capacitance shift register can be used to store information portrays a typical prior art input circuit including an input bias voltage gating device and capacitance.

In U.S. Pat. No. 3,801,826 there is taught the generation of a zero charge input level through the use of a diode for charging the input node to a reference level one threshold less than that of the clock levels.

U.S. Pat. No. 3,899,694 teaches the generation of bias reference voltage for charge transfer registers which are a function of device threshold.

U.S. Pat. No. 3,831,041 also teaches various additional circuits for providing bias voltages for such charge transfer devices.

U.S. Pat. No. 4,130,766 also assigned to the same assignee as the present invention, teaches a method for cancelling charge out-coupling from the first stage of a bucket brigade circuit by capacitivly coupling in an equal charge thus establishing the zero level of the charge in the first stage as a function of input voltage.

SUMMARY OF THE INVENTION

Broadly speaking, the present invention is directed toward a circuit for assuring that a fixed, background signal is injected into each charge transfer device array. This signal is proportional to the maximum charge transferable.

More particular, the present invention teaches that such an input bias circuit can be made self tracking with the charge transfer devices with which it is to be associated.

Still further, the present invention is such that the discharge level, on the input node of the charge transfer device array, is set to a level one threshold voltage drop above the reference level and that the charge, established on the input node, is automatically decreased to compensate for any decrease in charge transfer by the register device.

This eliminates the adjustment of dark signal bias required by the prior art and maintains throughout the array a uniform fat zero signal.

The fat zero is a circulating background charge equal to about 10 percent of the maximum signal. The fat zero keeps interface traps, with long emission constants, filled so they cannot contribute to transfer losses in the array.

The present invention teaches generation of a fat zero signal level which is independent of reference voltages on the charge transfer, shift register chip and comprises a background, i.e. a fat zero, generator circuit, coupled to the input of a charge transfer array, such as a bucket brigade shift register, which includes a capacitance, having a value proportional to the charge storing capacitance of the normal register stages desired for the reference charge level; and a means to discharge the capacitance to retain a charge which is a function of the processing parameters of charge transfer devices adjacent to the capacitance on the chip.

In a preferred embodiment the circuit includes a diode connected field effect transistor (FET) identical to the last active shift register device to which a capacitor is connected, which is connected to the proper shift register clocking phase to allow the capacitor to be discharged to one threshold voltage drop above the low level of the clock signal. This circuit permits the elimination of external reference bias voltage sources in such arrays. Previously such voltage sources had to be adjusted on a chip by chip basis for use with such scanner arrays, and other signal processing array devices, to achieve uniform signal ranges at the outputs of the charge amplifiers.

DESCRIPTION OF THE DRAWINGS

These and other features of the present invention will be more fully appreciated and understood by considering the following description taken in conjunction with the accompanying drawings.

DESCRIPTION OF THE PREFERRED EMBODIMENT

Figure 1:
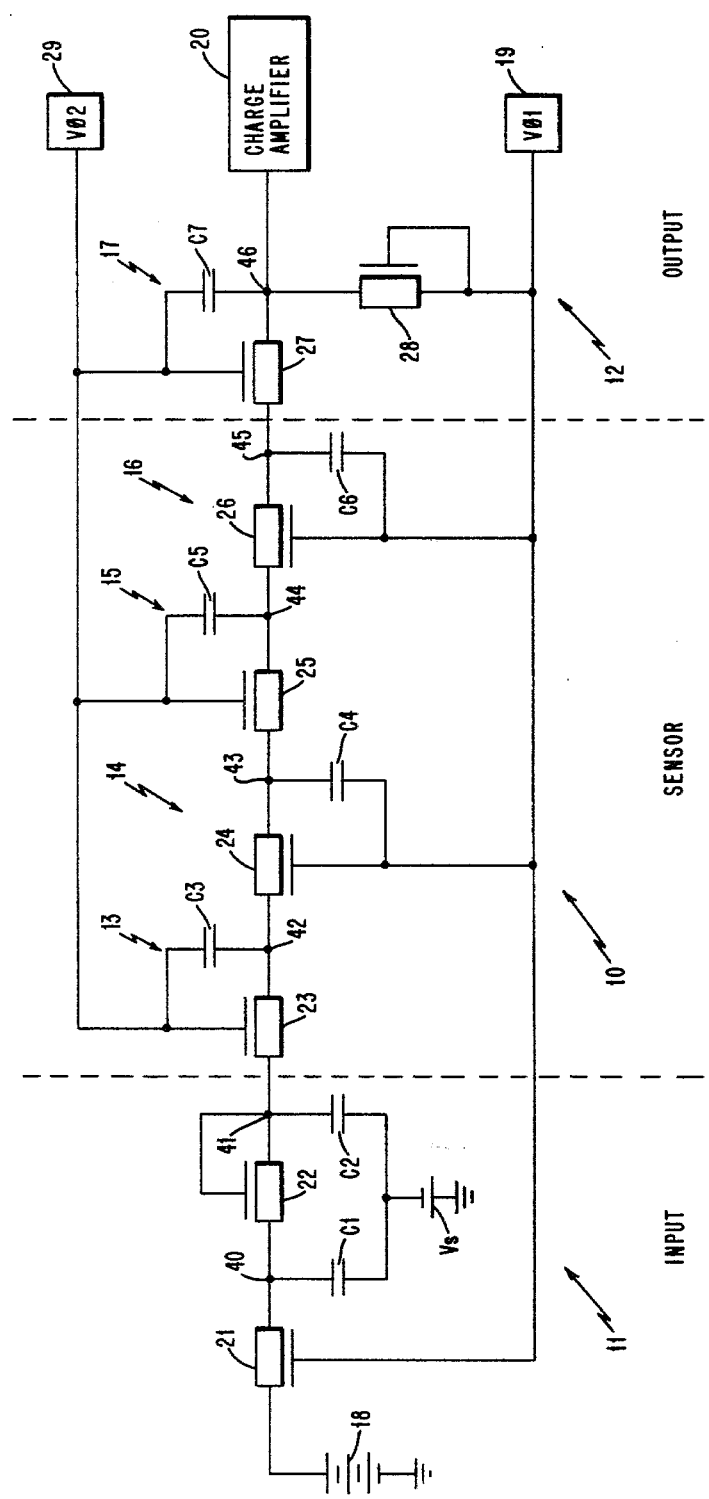
FIG. 1 illustrates, in schematic form a charge transfer bucket brigade array in accordance with the present invention.

Referring now to the drawings in more detail there is shown in FIG. 1 a schematic layout of a bucket brigade array together with its input and output circuits and in accordance with the present invention. The array shown is particularly useful as an optical sensor.

Charge transfer arrays are, at the present time, formed in a single chip of semiconductor material using well known integrated circuit techniques. Because of variations in the semiconductor materials such as resistivity, doping, and photolithography, it was necessary in the past to adjust the input voltage for each and every array circuit so formed.

The present invention avoids this adjustment problem by the simple expedient of introducing a transistor-diode and capacitor circuit at the input of the sensor portion of the array; which circuit is formed by the same techniques used to form all the other devices of the array. This circuit is self-tracking with all the rest of the elements of the array because it and each of the elements, of the array, are created by exactly the same techniques. In this way, the necessity of individually compensating for each formed array is avoided.

This unique invention is best illustrated schematically in FIG. 1. The array of the invention comprises a sensor 10, having coupled thereto, an input stage 11 and an output stage 12. The sensor 10 comprises a series of storage cells: circuits 13, 14, 15 and 16 arrayed between the input stage 11 and the output stage 12. It should be understood that for purposes of describing this invention only four storage cells are shown but that many cells can be used. Each storage cell circuit comprises a FET transistor 23, 24, 25 and 26 and a respective capacitor C3, C4, C5 and C6. The capacitor of each cell is connected between the gate of its respective transistor and its drain. Each transistor in the array is serially connected to the next adjacent transistor. Thus the input stage 11 is connected to the source of transistor 23. The drain of transistor 23 is connected to the source of transistor 24 and through capacitor C3 to its own gate and to a source of voltage pulses 29. The drain of transistor 24 is connected to the source of transistor 25 and through capacitor C4 to its own gate and to a source of voltage pulses 19. The drain of transistor 25 is connected to the source of transistor 26 and through capacitor C5 to its own gate and to source 29. The drain of transistor 26 is connected to the output and through capacitor C6 to its own gate and source 19.

The input stage 11 comprises a supply, shown as a three volt battery 18, coupled to the source of input transistor 21 whose gate is connected to source 19. The drain of transistor 21 is coupled through a capacitor C1 to a substrate voltage source Vs. This substrate voltage source Vs can be ground, i.e. zero volts or can be any desired voltage in accordance with well known principles of electrical design used in such integrated circuits. For convenience of description it will herein be presumed that the source Vs is at ground, i.e. zero volts.

The drain of transistor 21 is also coupled directly to the source of a transistor-diode 22 positioned between input transistor 21 and the first storage cell 13 of the array 10. The gate of the transistor 22 is directly connected to its drain thus forming a diode. The drain of transistor 22 is connected to the substrate voltage source Vs, through capacitor C2, and directly connected to the source of transistor 23 in the first storage cell 13.

The capacitors C1 and C2 need not be equal in size and indeed capacitor C1 can be many times larger than the capacitor C2 which, in an integrated circuit, can be the gate to source and source to substrate parasitic capacitance of transistor 23.

The output stage 12 includes a transistor-diode 28, a charge amplifier 20 and an output cell 17 which is identical to the storage cells 13, 14, 15 and 16 and is comprised of transistor 27 and capacitor C7. This output cell 17 is coupled between the last cell 16 of the sensor 10 and the charge amplifier 20. The source of transistor 27 is connected to the drain of transistor 26 in the last storage cell 16. The drain of transistor 27 is connected to its own gate and voltage source 29 through capacitor C7, directly to charge amplifier 20 and to voltage source 19 through the diode connected field effect transistor 28.

It should be noted that when used as an optical sensor only every other one of the storage cells 13, 14, 15 and 16 receive a light signal and all the other devices shown are shielded from light by appropriate means.

Figure 2:
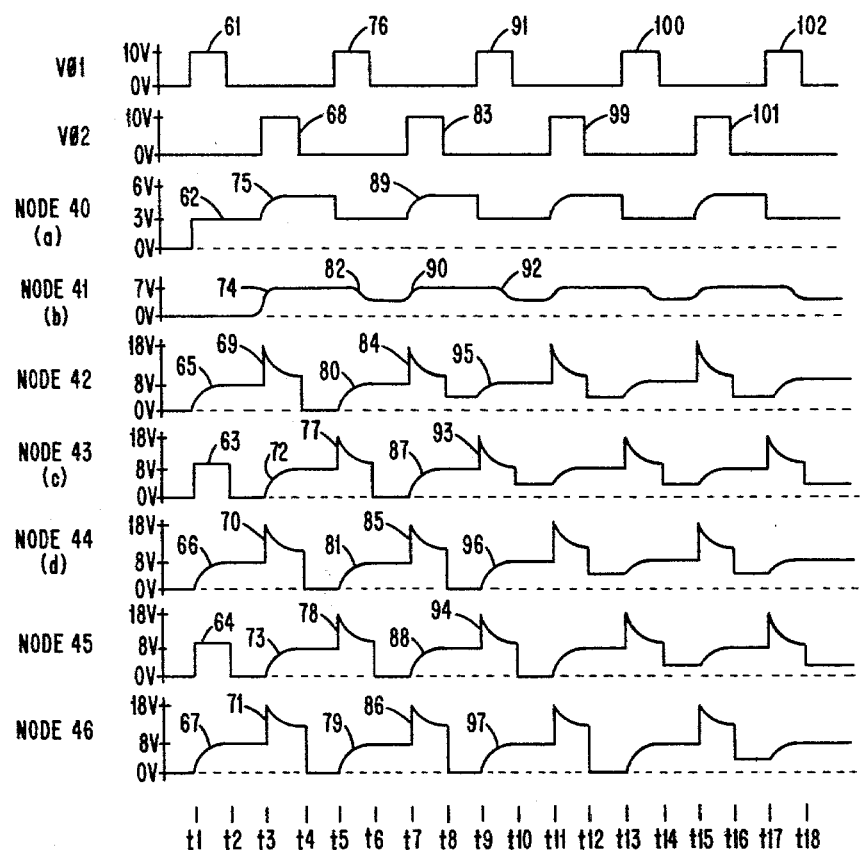
FIG. 2 illustrates voltage wave forms taken at appropriate points in the circuit of FIG. 1 and the information extracted therefrom.

FIG. 2 illustrates as a function of time, variations in the voltage pulses applied to the circuits of the invention from the various voltage supplies 19, 29 as well as the voltage pulses taken in the cells at various nodes at different times.

The described array when built in integrated circuit form is, as discussed above, particularly adapted for use as an optical sensor. When used as such, information is written into the array 10 by exposing the array 10 to light, such that a charge previously stored in the cell array capacitors is caused to be discharged in proportion to the amount of light received by each cell. This is a typical operation of such optical sensors. The characteristic of charge transfer devices and bucket brigade devices, especially as shown in FIG. 1, is the increasing transfer loss as signal charge decreases for one or a few bits within a long register. Thus, propagation of a "fat zero" bias level reduces the data smearing effect of this transfer loss.

The circuit shown in FIG. 1 particularly generates a fat zero charge level that is compensated to full charge signal due to process variables. For example, the circuit permits a 15% fat zero to be generated regardless of the process variations in such characteristics as threshold voltage, oxide and diffusion capacitance, etc.

This circuit especially eliminates the problem of threshold voltage variation. The diode-transistor 22 in the input circuit is especially utilized for generating a background level in the array devices to provide a background level in each of the active array cells 13, 14, 15 and 16, i.e. fat 0's. By establishing such a background level in each of the active cells, it has been found that a more efficient transfer of charge along the register of both 1's and 0's is possible. Thus the efficiency of transfer is improved where a minimum background charge level represents "no signal".

This background level (fat zero) is introduced into the array in the following manner: As shown in FIG. 2 at Time t1, a 10 volt pulse 61 from the source 19 is applied to the gate of transistors 21, 24, 26 and 28 causing these devices to turn on and become conductive. When transistor 21 turns on, the node 40, which is one plate of Capacitor C1, becomes set at the three volt level of the voltage source 18 as shown by curve 62. When the 10 volt pulse from voltage source 19 is applied to the gate of transistors 24 and 26, capacitor coupling action, through capacitors C4 and C6 respectively, causes nodes 43 and 45 to both rise to ten volts as shown by pulses 63 and 64. The application of the 10 volt pulse to these transistors and these nodes thus causes nodes 42 and 44 to rise to the 8 volt level as shown by curves 65 and 66. Nodes 41 and 44 rise only to the 8 volt level because there is approximately a 2 volt threshold drop through each of the transistors 24 and 26. Simultaneously, the application of the pulse 61 to the transistor 28 causes node 46 to also rise to the 8 volts level. Because node 41 is isolated by virtue of transistor 23 being off, it remains at zero volts.

At time t2, the pulse at 61 terminates, and transistors 21, 24, 26, and 28 are shut off and nodes 43 and 45 return to zero. Because nodes 40, 42, 44 and 46 are now isolated, they remain at the voltage to which they were raised. However, because nodes 43 and 45 were only capacitively coupled to the source 19, they return to zero volts.

At time t3, the supply 29 turns on and applies a 10 volt pulse 68 to the gates of transistors 23, 25 and 27. Once again through capacitive coupling action, nodes 42, 44, and 46 rise from 8 volts to 18 volts as indicated by curves 69, 70 and 71. When transistors 23, 25, and 27 are turned on, charge transfer through the transistors begins and the nodes 42, 44 and 46 fall. The nodes 43 and 45 rise to 8 volts which is one threshold voltage below the applied gate voltage pulse 68. As indicated by curves 72 and 73. When transistor 23 turns on and node 42 rises to 18 volts, the node 41 is coupled through transistor 23 to the node 42 and it tries to rise to 8 volts. Thus, node 41 is coupled through transistor 23 to the entire charge transfer device. However, because the transistor 22 is coupled as a diode, node 41 immediately becomes coupled to node 40 through transistor diode 22. Thus node 41 only rises to about seven volts (instead of eight volts) and the node 40 rises to about five volts which is once again a threshold below the voltage applied to the gate of the transistor 22. This rise in voltage of the node 41 is indicated as pulse 74 and the rise of node 40 is indicated as pulse of 75. At time T4 the pulse terminates and the nodes 42, 44, and 46 all return to zero. However, because of isolation nodes 40, 41, 43 and 45 all remain at the levels which they have been set. At time T5 the volt supply 19 is again turned on and a pulse 76 is now applied to the gate of transistors 21, 24, 26, and 28. This now causes node 43 and 45 to rise to the 18 volt level in the same manner that nodes 42, 44, and 46 previously increased. This rise in the nodes of 43 and 45 due to capacitor coupling action, is shown by the curves 77 and 78 respectfully. Again node 46 rises to the 8 volt level as shown by curve 79 and nodes of 42 and 44 rise to one threshold level below the gate voltage applied to transistors 24 and 26 as indicated by curves 80 and 81. Simultaneously node 40 is now reduced down to the 3 volt level by the turning on of transistor 21 and node 41 is reduced from seven volts to a 5 volt level which is a threshold above the level to which node 40 has been reduced. This is shown by the decrease in slope of curve 82. The voltage change on nodes 40 and 41 generate the fat zero level to be propagated into the charge transfer array. The fat zero charge can be determined from the relationship: $Q_{fz}=C_1 \cdot \Delta V_{40}+C_2 \cdot \Delta V_{41}$. The fat zero level is "shifted" into the charge transfer array in the following manner: At time t6 pulse 76 terminates, nodes 43 and 45 return to zero while the remainder of the nodes remain at the voltages to which they were previously set. At time t7 supply 29 provides a pulse 83 to the gates of transistors 23, 25 and 27, causing nodes 42, 44, and 46 to rise to 18 volts and nodes 43 and 45 to rise to 8 volts. This is depicted by curves 84, 85, 86 and 88 respectfully. Again node 40 rises to 5 volts as indicated by pulse 89 and node 41 rises to the 7 volt level indicated by pulse 90. At time t8 pulse 83 terminates and nodes 44 and 46 return to zero while nodes 43 and 45 remain at the 8 volt level. It should be noted however that the node 42 does not return to zero, but remains at the two volt level. At this point in time a fat zero has now been introduced into the first cell 13 of the array. At time t9 source 19 supplies a 10 volt pulse 91 which causes node 40 to return to the 3 volt level and node 41 to decline to the 5 volt level as indicated by pulse 92. Simultaneously nodes 43 and 45 go to 18 volts indicated by pulses 93 and 94 respectively which in turn causes nodes 42, 44 and 46 to rise to 8 volts as shown by pulses 95, 96, and 97 respectfully. At time t10 pulse 91 is terminated and node 43 declines to the 2 volt level while node 45 returns to zero. Thus at this time both nodes 42 and 43, i.e., cells 13 and 14 have a 2 volt level introduced into them.

In this way, the 2 volt fat zero level is transferred into the entire array by the sequential applications of additional pulses from sources 29 and 19. The additional pulses 99, 100, 101 and 102 cause the fat zero to be propagated down the entire array. By following the previously mentioned sequence, it can be seen that when pulse 99 terminates at time t12 the node 44 does not return to zero but instead is left at the fat zero level of two volts. And at time t14 when node 100 terminates node 45 is left at the fat zero level, while node 46 receives the fat zero level at time t16 upon termination of pulse 101. At this time t16 a fat zero has been propagated down the entire array to the charge amplifier and each array cell 13, 14, 15 and 16 now has a fat zero introduced into it.

Because the described array, when built as an integrated circuit, is particularly adapted for use as an optical sense array, information may be written into the array by exposing the array to light so that a charge is stored in each array cell which is not shielded; i.e. cells 13 and 15 can be caused to be charged in proportion to the amount of light received by each cell.

For purposes of convenience and explanation only we will assume that each of the storage cells 13, 14, 15 and 16 have had their respective capacitors C3, C4, C5 and C6 set to "fat zero" so that if one or more cells receive no light, the transfer efficiency is improved for those cells with a light signal.

Once the storage cells are set to fat zero the array can now be utilized as, a scanner or the like, as is well known to the charge transfer, i.e., charge coupled or bucket brigade technology.

It should be understood that the above described invention is particularly applicable to surface channel charge coupled devices and to bucket brigade devices.

It should also be understood that improvements, changes or modifications in form and detail could be made to the described embodiment without departing from the spirit and scope of the invention.

What is claimed is:

1. A fat zero charge generator for a charge-transfer device, comprising:
   a voltage node;
   a source of reference potential;
   capacitance means coupled to said voltage node;
   means for periodically coupling said voltage node to said charge-transfer device to provide transfer of a predetermined quantity of charge between said voltage node and said charge-transfer device representative of a minimum transferable charge; and
   semiconductor means having a threshold voltage drop coupled to said voltage node for discharging said capacitance means to a voltage, established by said threshold voltage drop of said semiconductor means, above said reference potential when said voltage node is uncoupled from said charge-transfer device.

2. The generator of claim 1 wherein said semiconductor means comprises a field effect transistor having gate, drain and source electrodes, and said gate is directly connected to its drain.

3. The generator of claim 2 wherein said capacitance means comprises the gate to source and source to substrate parasitic capacitance of said semiconductor means.

4. The generator of claim 1 wherein said semiconductor means comprises a diode.

5. The generator of claim 1 wherein said means for periodically coupling said voltage node to said charge transfer device comprises a field effect transistor in the first cell of said array.

6. A storage system comprising:
   a series shift register array composed of a plurality of capacitance charge transfer cells serially arranged between an input terminal and an output terminal, each cell storing a single bit of information and consisting of only a transistor having input, output, and control terminals and a storage capacitor connected between the output terminal of the transistor and its control terminal, an input stage coupled to the input terminal of said series shift register, an output stage coupled to the output terminal of said series shift register, first voltage means coupled to the control terminals of alternate cells in the series for introducing into the storage system a first sequence of pulses to cause the information in said alternate cells to be sequentially transferred to cells positioned adjacent said alternate cells, and second voltage means coupled to the control terminals of said adjacent cells for intorducing into the storage system a second sequence of pulses to cause the information in said adjacent cells to be sequentially transferred into said alternate cells, said input stage including a fat zero charge generator comprising a capacitively loaded semiconductor device.

7. The apparatus of claim 6 wherein said output stage includes a sense amplifier for detecting the transfer of information out of said shift register.

8. The apparatus of claim 6 wherein said output stage further includes a capacitive charge transfer cell serially coupled between the output terminal of said series shift register array and said sense amplifier.

9. The apparatus of claim 6 wherein said input stage includes a direct current power supply.

10. A storage system comprising:

a series shift register array composed of a plurality of capacitive charge transfer cells serially arranged between an input terminal and an output terminal, each cell storing a single bit of information and consisting of only a transistor having input, output, and control terminals and a storage capacitor connected between the output terminal of the transistor and its control terminal, an input stage coupled to the input terminal of said series shift register, an output stage coupled to the output terminal of said series shift register, first voltage means coupled to the control terminals of alternate cells in the series for introducing into the storage system a first sequence of pulses to cause the information in said alternate cells to be sequentially transferred to cells positioned adjacent said alternate cells, and second voltage means coupled to the control terminals of said adjacent cells for introducing into the storage system a second sequence of pulses to cause the information in said adjacent cells to be sequentially transferred into said alternate cells, said input stage including a first voltage node, a source of reference potential, first capacitance means connected to said first voltage node, means for periodically electrically coupling said source of reference potential to said first voltage node and said first capacitance means to charge said first capacitance means to a selected potential a second voltage node, a second capacitor, coupled to said second voltage node, and a semiconductor diode coupled between said first and said second voltage node for charging said second voltage node to a level determined by said selected potential and the characteristic of said diode.

11. A fat zero charge generator for a charge-transfer device, comprising:

a voltage node;

a source of reference potential;

capacitance means connected to said voltage node;

means for periodically electrically coupling said voltage node to said charge-transfer device to provide transfer of a predetermined quantity of charge between said voltage node and said charge-transfer device representative of a minimum transferable charge; and diode-connected semiconductor means coupled to said voltage node for predischarging said capacitance means to within one diode voltage drop of said reference potential during a time other than when said voltage node is coupled to said charge-transfer device.

* * * * *